United States Patent [19]
Frigerio et al.

[11] Patent Number: 5,774,509
[45] Date of Patent: Jun. 30, 1998

[54] METHOD FOR THE REDUCTION OF PHASE NOISE INTRODUCED BY THE SDH NETWORK (SYNCHRONOUS DIGITAL HIERARCHY NETWORK) BY POINTER JUSTIFICATION AND INTEGRATED CIRCUITS FOR THE IMPLEMENTATION OF THE METHOD

[75] Inventors: Silvano Frigerio, Cantu; Stefano Gastaldello, Teolo; Giovanni Russo, Lentini, all of Italy

[73] Assignee: Alcatel Telettra S.p.A., Milan, Italy

[21] Appl. No.: 247,607

[22] Filed: May 23, 1994

Related U.S. Application Data

[63] Continuation-in-part of Ser. No. 810,719, Dec. 18, 1991, abandoned.

[30] Foreign Application Priority Data

Dec. 21, 1990 [IT] Italy ........................................ 22495/90

[51] Int. Cl.⁶ .............................. H04L 7/00; H04L 25/36; H04L 25/40
[52] U.S. Cl. .......................... 375/371; 375/376; 375/350; 370/516
[58] Field of Search .................................. 375/118, 119, 375/120, 103, 99, 111, 346, 362, 350, 371, 373, 375, 376; 370/105.3, 100.1, 503, 516, 518

[56] References Cited

U.S. PATENT DOCUMENTS

| | | | |
|---|---|---|---|
| 4,370,749 | 1/1983 | Levy et al. | 375/119 |
| 4,860,319 | 8/1989 | Yoshida | 375/118 |
| 5,056,054 | 10/1991 | Wong et al. | 375/119 |
| 5,195,088 | 3/1993 | Urbansky | 375/118 |

OTHER PUBLICATIONS

British Telecom Contribution to T1 Standards Project T1X1 6/89 012; 2 Feb. 1989 A. Reid, "Sonet Desynchronisers".
Electronics Letters vol. 26, No. 16, 2 Aug. 1990, Stevenage GB, pp. 1227–1228, R. Nawrocki et al.

*Primary Examiner*—Don N. Vo
*Attorney, Agent, or Firm*—Ostrolenk, Faber, Gerb & Soffen, LLP

[57] ABSTRACT

A method and apparatus for reducing the phase noise introduced by pointer justification from a synchronous digital hierarchy network in a transmitted numerical signal. In the method and apparatus, occasional redundancies associated with bit justifications and fixed redundancies are combined with occasional prefiltered redundancies associated with the pointer justifications, and the combined signal is filtered in an analog phase locked loop. The occasional redundancies associated with the pointer justifications and at least part of the fixed redundancies with or without bit justifications are prefiltered in two stages, and the prefiltered signals are combined with the occasional redundancies associated with the bit justifications whenever these occasional redundancies are not prefiltered.

11 Claims, 7 Drawing Sheets

METHOD FOR THE REDUCTION OF PHASE NOISE INTRODUCED BY THE SDH NETWORK (SYNCHRONOUS DIGITAL HIERARCHY NETWORK) BY POINTER JUSTIFICATION AND INTEGRATED CIRCUITS FOR THE IMPLEMENTATION OF THE METHOD

This is a continuation-in-part of application Ser. No. 07/810,719, filed Dec. 18, 1991, now abandoned.

BACKGROUND OF THE INVENTION

1. Field of the Invention

The present invention relates to a method for reducing phase noise in transmitted digital signals and, more specifically to a method for reducing the phase noise introduced in a transmitted digital signal through pointer justification by the SDH network (Synchronous Digital Hierarchy Network). The present invention also relates to a circuit for implementing the method.

2. Description of the Related Art

It is known that resynchronization of VC (Virtual Container) in a node of a SDH network is obtained by pointer justification. Pointer justification is described in great detail and according to the VC type in recommendations G.708 and G.709 drafted by CCITT, herein incorporated by reference. For a good comprehension of the following, it is sufficient to note that each pointer justification corresponds to a sharp phase variation of VC, having a signal polarity the same as the justification and with a magnitude depending on the type of considered VC (in any case not under 8 [UI] ("Information Units")), with respect to the synchronous transport frame.

Further, it is known that when all of the nodes along the path between the source and receiver are synchronized, pointer justification operates only to adjust slowly varying phase differences between the clocks of the nodes. This causes the receiver node, over a sufficiently long observation time, to have an equal number of positive and negative pointer justifications. In better detail, the statistics of pointer justifications obtained by several authors, simulating the behavior of the network in the hypothetical situation where all of nodes are synchronized, show that the majority of pointer justifications are considered as "single" justifications by the receiver. Further, they show as the sequence formed by a double pointer justification followed by another double pointer justification of the opposite polarity, in case the periods between adjustments of opposite polarity are greater than the receiver time constant, represents, among the sequences which can happen with a probability different from zero, the more critical sequence in terms of phase noise introduced into the network in the case that all nodes are synchronized.

Further, it is known that the statistics of the pointer justifications at the reception node are significantly different from the preceding case, if the source and/or receiver node, having lost the network synchronism, are independently clocked. In this case, there is generally a frequency difference between the clock that has created the VC and the clock that ends it. The frequency difference has a maximum value when both nodes are not synchronized with the network and clocked in a manner suitable for showing the maximum allowed frequency difference with opposite sign among one another. This causes all justifications to have the same polarity and to be spaced apart by an equal quantity which is inversely proportional to the frequency difference present between the two above-mentioned clocks in the receiver node.

Further, it is known that the sharp phase variations associated with pointer justifications, if filtered with a "traditional" APLL (Analog Phase Locked Loop), raise the phase noise to a level higher than the limit established by the international standards (CCITT, e.g., standard G.783 for the synchronous multiplexers). In fact, to satisfy the above-mentioned standards, it is necessary to use an APLL with a very narrow bandwidth that cannot be readily implemented due to hardware limits.

Figure 1:
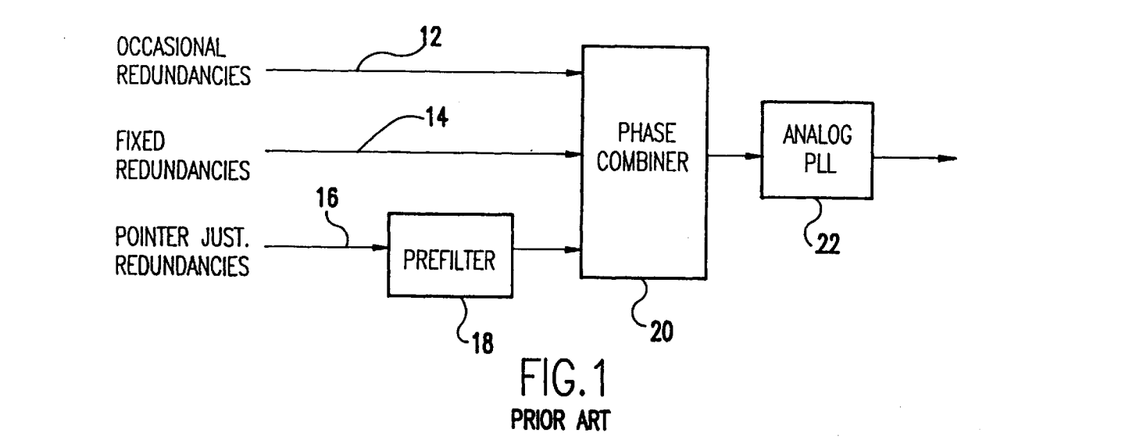
FIG. 1 is a block diagram of a prior art circuit for reducing the phase noise introduced by the SDH network using pointer justification.

In the prior art literature, some methods have been proposed for reducing the phase noise introduced by the SDH network using the pointer justifications. They are based on the idea of prefiltering the phase variations caused by the pointer justifications before reconstructing the continuous data flow by the "traditional" APLL, as shown in FIG. 1 (in which the occasional redundancies associated with the bit justifications are input on line 12, the fixed redundancies are input on line 14, and the occasional redundancies associated with the pointer justifications are input on line 16; prefilter 18, phase combiner 20 and APLL 22 by which the continuous data flow is reconstructed are also illustrated).

These methods differ in the type of prefilter 18 made on the above-mentioned phase variations, of the redundancies associated with the pointer justifications.

A first method proposed in the prior art literature, known by the name of "fixed bit leaking", uses a prefilter 18 that uniformly spreads each phase jump associated with a pointer justification during a fixed time table. As mentioned above, the loss of synchronism between the transmitter and/or receiver node(s) causes the receiver to produce all justifications having the same sign and spaced equally with one another. When using this method, the phase jump associated with a justification is not prefiltered until the jump caused by the preceding justification is completely recovered. As a result, it can be argued that, if information data must not be lost, it is necessary to limit the period table and therefore also the prefiltering value that can be obtained. This limit appears excessive for the largest part of multiplexing paths foreseen by the synchronous hierarchy. Therefore this method, although advantageous due to its implementation simplicity, cannot be considered a generally satisfactory method for the reduction of phase noise joined to the pointer justifications.

The above-mentioned drawback is overcome using more complex methods that use adaptive algorithms for prefiltering. An improvement in this direction was shown during the meeting of work group ETSI TM3 held in Munich on Oct. 15–19, 1990. The proposed method includes the use of a digital phase locked loop (DPLL) of the second order, with a sufficiently narrow bandwidth and with the output quantized in steps of 1 for prefiltering the phase variations associated with the pointer justifications GP(3).

For reducing the effects of sharp phase variations caused by the output quantization, an adder node was introduced, used for adding a RAM stored "dither" inside the loop forming the DPLL.

Although this method is valid on the whole, it has the following drawbacks:

1) the high cost of the RAM that supplies the "dither" signal in digital form;
2) the presence of a high frequency phase noise caused by the "dither" signal and not completely negligible;
3) the modality by which the "dither" signal is chosen according to other system parameters is not clear.

SUMMARY OF THE INVENTION

Figure 2:
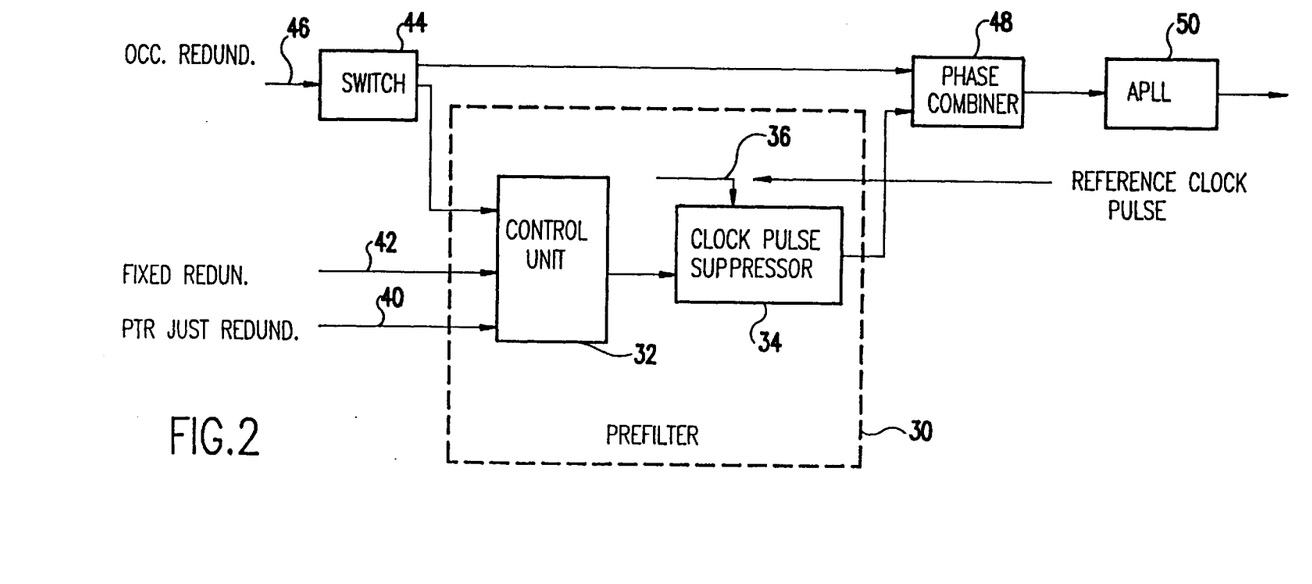
FIG. 2 is a block diagram of the circuit of the present invention.

An objective of the present invention is to supply a method and a related implementation device that prevents, among other things, the above-mentioned drawbacks. The method according to the invention, as shown in FIG. 2, involves prefiltering at least the fixed and the occasional redundancies associated with the pointer justifications to supply a signal which can be easily filtered.

In greater detail, the method of the present invention includes the following objectives:

1) to establish the ideal response law of prefilter; e.g., the law corresponding to a PLL of the second order;
2) to detect the presence of occasional redundancies and to establish if it is necessary to prefilter also the redundancies associated with the bit justifications;
3) to decide and perform a pulse suppression on the reference clock to obtain a modified clock signal with suppressed pulses so that, with a phase difference as minimum as possible, the prefilter output coincides with the ideal output established at (1);
4) to accommodate the bit justifications, if they are not prefiltered, in the modified clock signal obtained at point (3); this can be done, e.g., by suppressing a clock pulse in conjunction with a positive bit justification and eliminating a clock pulse suppression in case of a negative bit justification;
5) to filter, by the "traditional" PLL, the data flow received and re-clocked by the clock obtained in (4) to reconstruct a continuous data flow.

Other features and advantages of the present invention will become apparent from the following description of the invention which refers to the accompanying drawings.

DETAILED DESCRIPTION OF THE PREFERRED EMBODIMENTS

FIG. 2 shows the block scheme of the device according to the invention, including the two-stage prefilter 30, having block 32 that establishes where clock pulses must be suppressed and block 34 that, after having received the control from block 32, suppresses selected clock pulses in the reference clock pulse received on line 36. As shown, now not only the occasional redundancies associated with the pointer justifications received on line 40 are prefiltered, but also the fixed redundancies received on line 42.

According to a feature of the invention, it can be established, by operating switch 44, if the occasional redundancies associated with the bit justifications received on line 46 must be sent to prefilter 30, or if they must be applied directly to the phase combiner 48 and then to the APLL 50.

Figure 3:
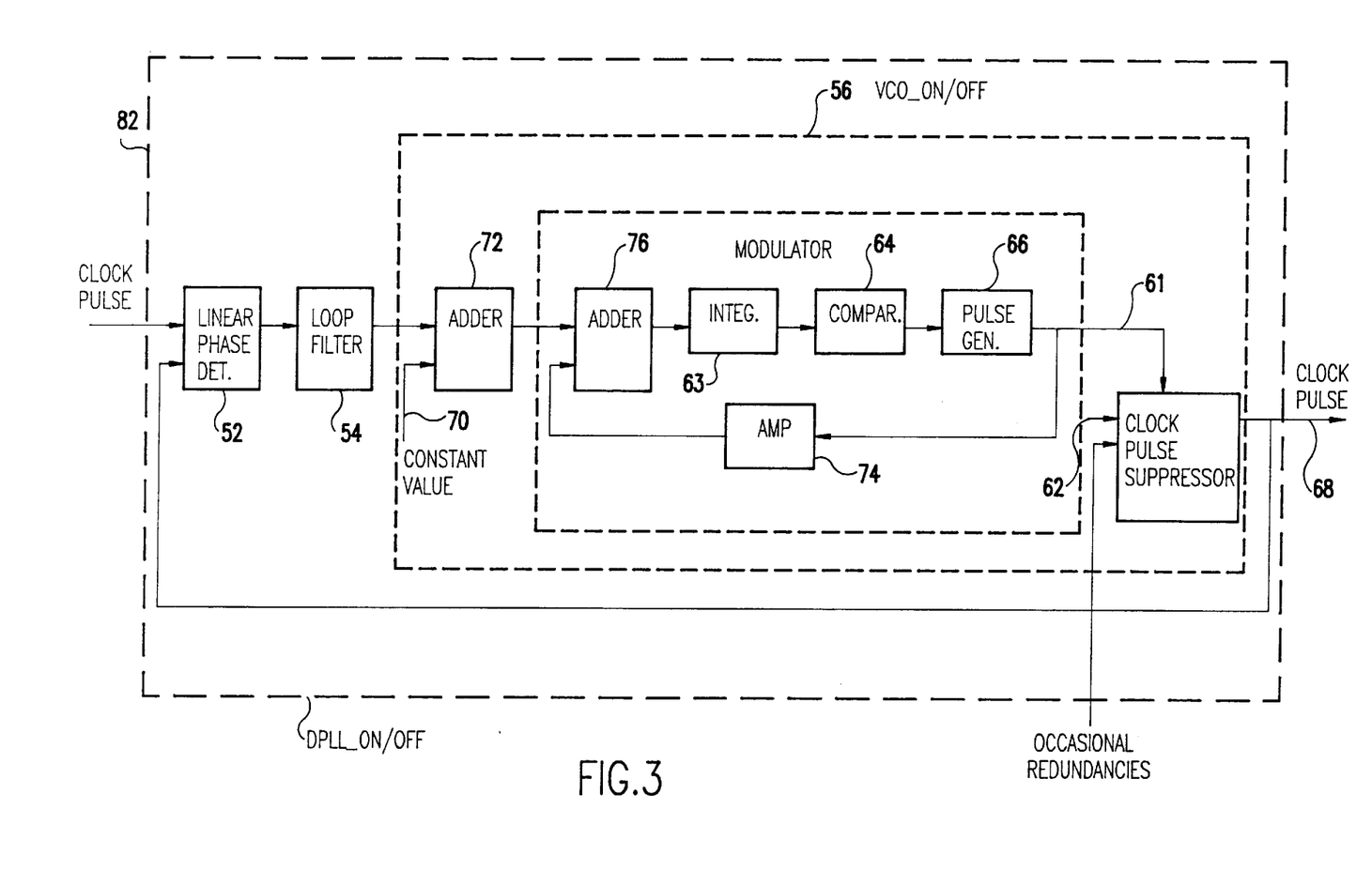
FIG. 3 is a block diagram of the digital phase locked loop (DPLL_ON/OFF) used in the present invention.

The selection preferred to establish the ideal response law of the prefilter, e.g., the law corresponding to a PLL of the second order, foresees the use of a second order negative feedback system called a digital phase locked loop (DPLL_ON/OFF), a block schematic of which is shown in FIG. 3. The DPLL_ON/OFF is formed by the following components:

1) linear phase detector 52;
2) loop filter 54 of the first order;
3) VCO_ON/OFF 56 and, according to an advantageous feature of the invention, it differs from a usual digital phase locked loop in the operation of the VCO. The VCO is substantially formed by a modulator 60 that generates at its output the pulses 61 in conjunction with the clock pulses to be suppressed in the reference clock pulse 36.

The modulator 60 is also a negative feedback system that, as shown in FIG. 3, is formed substantially by an integrator 63, a comparator 64 with a threshold value and a pulse generator 66. Each time the integrated signal exceeds the threshold value, a pulse is generated that, being fed back at input with a proper gain, brings the integrated signal once again under threshold.

The clock pulse 68 obtained in this manner is the output of the prefilter 30. The clock period is equal to the period of the reference pulse 36 and the mean frequency is equal to the frequency of reference clock pulse 36 from which the mean frequency of pulses generated by the modulator 60 is subtracted.

Figure 4A:
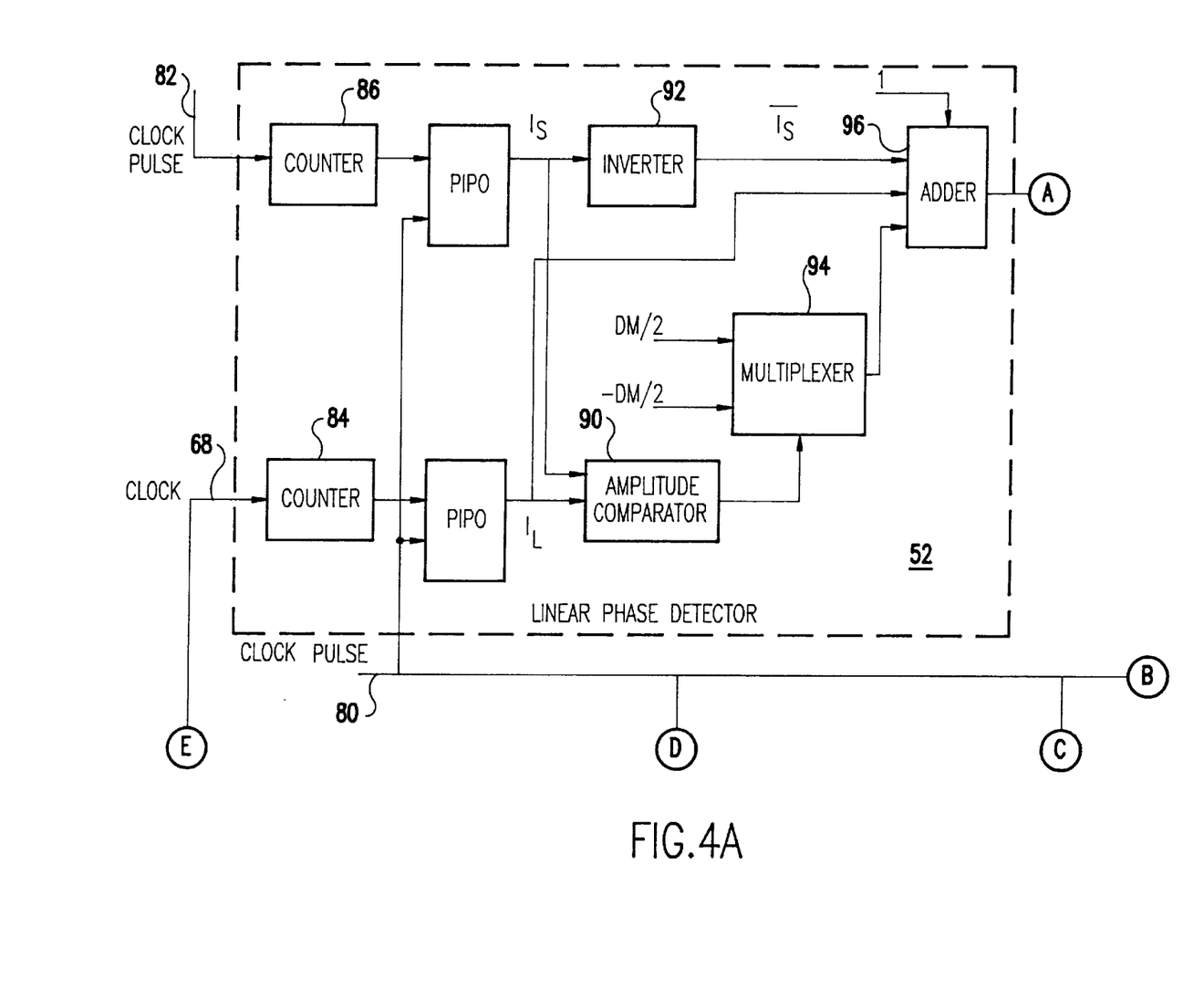
FIG. 4 is a block diagram of the preferred digital implementation of the circuit of FIG. 3.
Figure 4B:
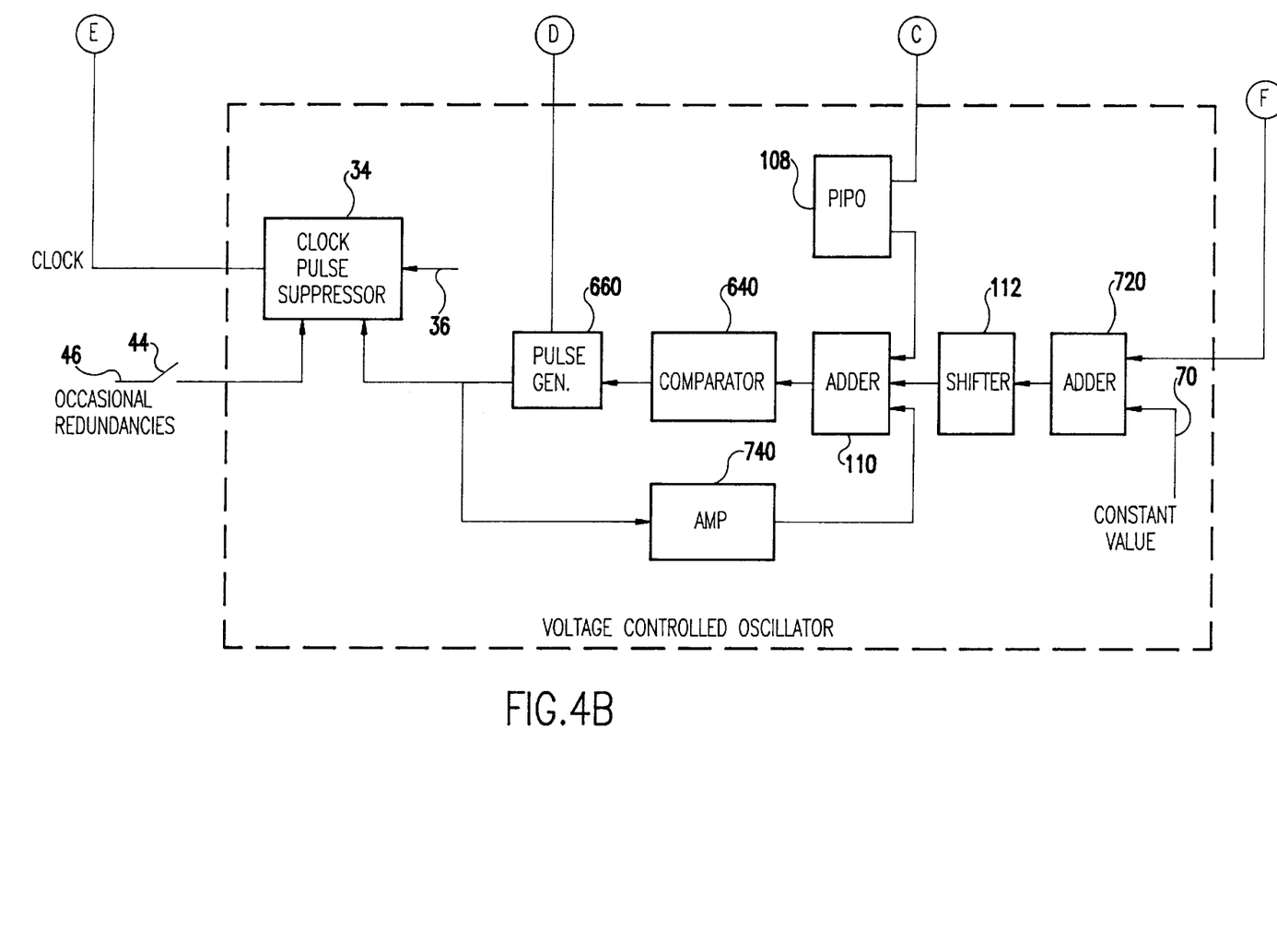
Figure 4C:
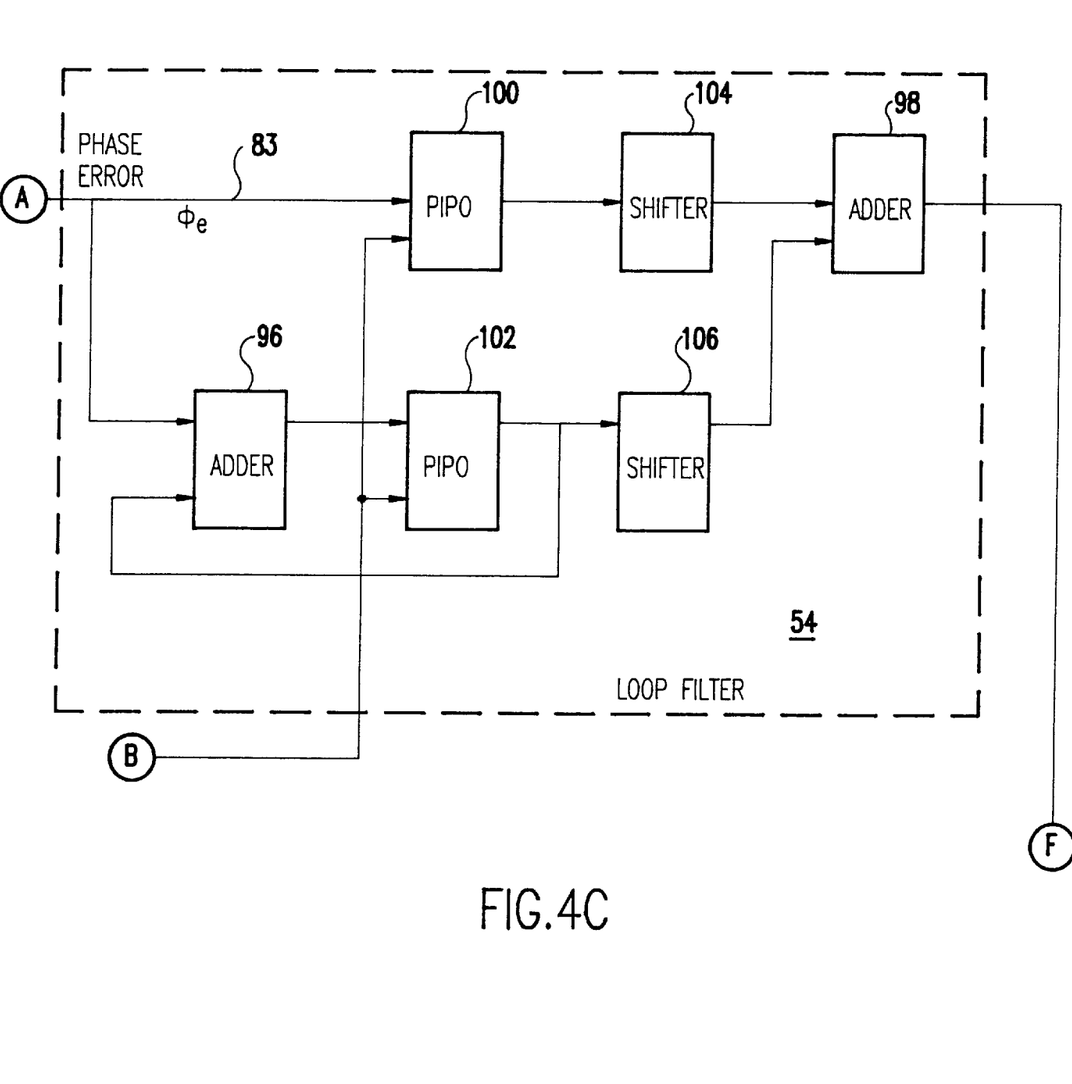

The free oscillation frequency of VCO_ON/OFF, keeping constant all remaining parameters, depends on the value of constant 70 added by means of the adder 72 with a linear law, while its gain is inversely proportional to the gain K of block amplifier 74 combined at adder 76. A preferred implementation of DPLL_ON/OFF is shown in FIG. 4. In this figure, a schematic diagram is shown of a digital implementation of linear phase detector 52, loop filter 54 and VCO_ON/OFF 56 which together form DPLL_ON/OFF (FIG. 3).

The linear phase detector 52 supplies the phase error, given in [UI] and sampled at instants of time programmed by the clock pulse 80 between the clock pulse 82 associated with the received information data flow and the clock 68 of DPLL output.

In particular, the phase error $\phi_e$ 83 is given by:

$$\phi_e = |I_L - I_S|_{DM} - DM/2 \tag{1}$$

where $I_L$ and $I_S$ are respectively the status of counters 84 and 86 in conjunction with the upgrading behaviors of clock pulse 80, and DM indicates an integer constant of suitable value such that the phase error $\phi_C$ will equal zero when the value of the counter $I_S$ is very far from the value of the counter $I_L$. The counters $I_S$ and $I_L$ are used as writing and reading addresses of buffer 134, and DM is the size of the buffer. In this way, the writing period is in opposition with respect to the reading period. The above-mentioned counters count in a cyclic manner between $\phi$ and DM−1 and the numerical representations of its status, $I_L$ and $I_S$, are always numbers included between 0 and DM−1.

In this condition, it is easy to see that the equation (1) can be written in the following manner:

$$\phi_e = I_L \bar{I}_S - DM/2 + 1 \text{ if } I_L \geq I_S \tag{2a}$$

$$\phi_e = I_L \bar{I}_S - DM/2 + 1 \text{ if } I_L \leq I_S \tag{2b}$$

This processing is performed by the amplitude comparator 90, inverter 92, multiplex 94, and adder 96. In particular, the amplitude comparator 90 compares the value of $I_L$ and $I_S$ and supplies an output that selects, by means of multiplexer 94, the value DM/2 or −DM/2 that must be, each time, used by the adder 96 with the aim of obtaining the usual value of the phase error $\phi_e$ 83. The inverter 92 carries out the inversion of all elements of the bus $I_S$ and feeds the bus identified by $\overline{I}_S$.

The loop filter 54 has a pole in the origin and is sized so that the band gain of DPLL is under 0.5 dB. It is formed by two adders 96 and 98, by two PIPOs (Parallel Input Parallel Output) 100 and 102, and by two shifters 104 and 106 that calculate the product between the input and the number expressed as a power of the base two having the gain of the same shifter.

The VCO__ON/OFF 56, as shown in FIG. 4, is a preferred digital implementation of the same device. The integration operation, performed by the integrator 63 of FIG. 3, is obtained digitally by means of the accumulator formed by the PIPO 108 and by the adder 110, with shifter 112 of FIG. 4. All other blocks of FIG. 4 forming the VCO__ON/OFF 56 have the same function as the corresponding blocks of FIG. 3 and differ from these only by being implemented in a digital manner. It can be easily shown that the VCO__ON/OFF of FIG. 4 has a gain and a free oscillation frequency given respectively by:

$$ko+-fc * k1/k \qquad (3)$$

$$fo=fr-ko * xo \qquad (4)$$

where fc indicates the clock frequency 80, fr the reference clock frequency 36, k1 the gain of shifter 112, k the gain of the block 74D, and xo the value of the constant 70.

Figure 5:
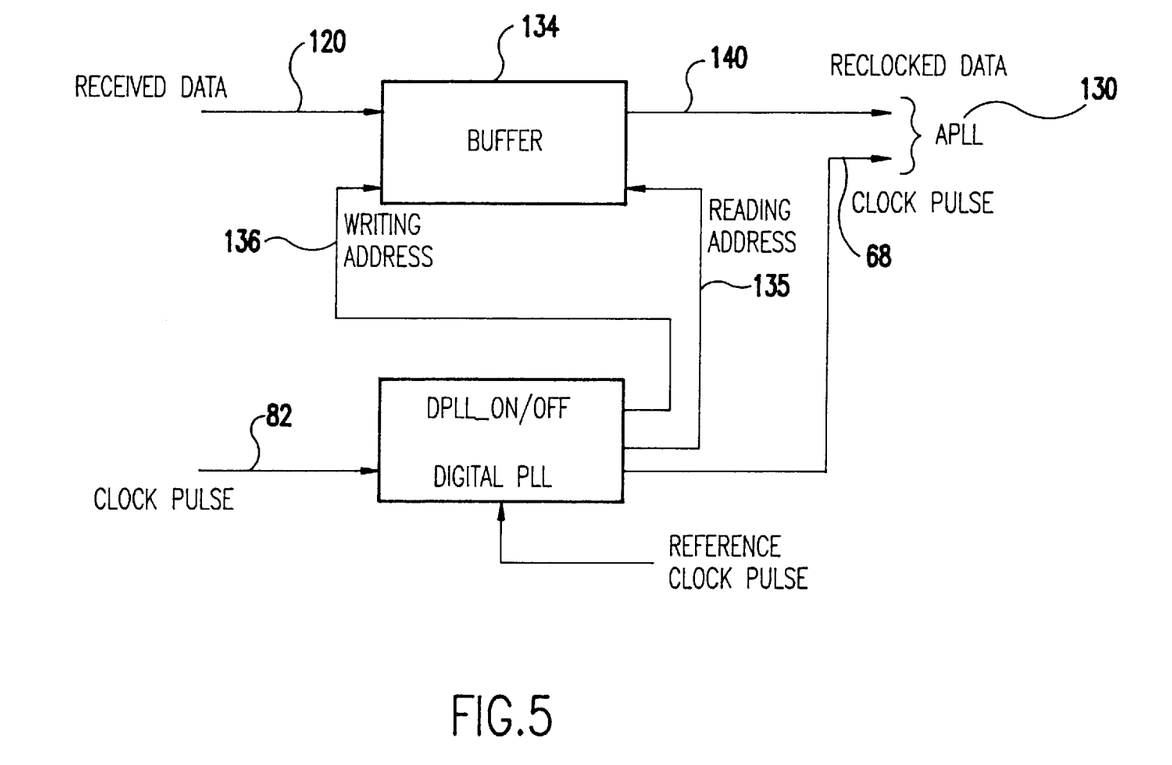
FIG. 5 shows a preferred implementation of the invention.

A preferred implementation of the method of the invention is shown in FIG. 5. The data received 120 and clocked by the clock pulse 82, holding all types of redundancies 46, 42 and 40, are re-clocked by the pulse 68 before being filtered by the "traditional" APLL 130. The above-mentioned new re-clocking is possible due to the presence of the elastic memory (buffer) 134, in which the information bits received, with the rates supplied respectively by clocks 82 and 68, are written and read. The rates are obtained by using as the writing address 136 and reading address 138 of the elastic memory 134, respectively, the status of counters 86 and 84. Therefore, the re-clocked data 140 and the related timing clock 68 are sent to a "traditional" APLL 130 that erases the suppressed clock pulses of clock 68 and reconstructs a continuous data flow.

Figure 6:
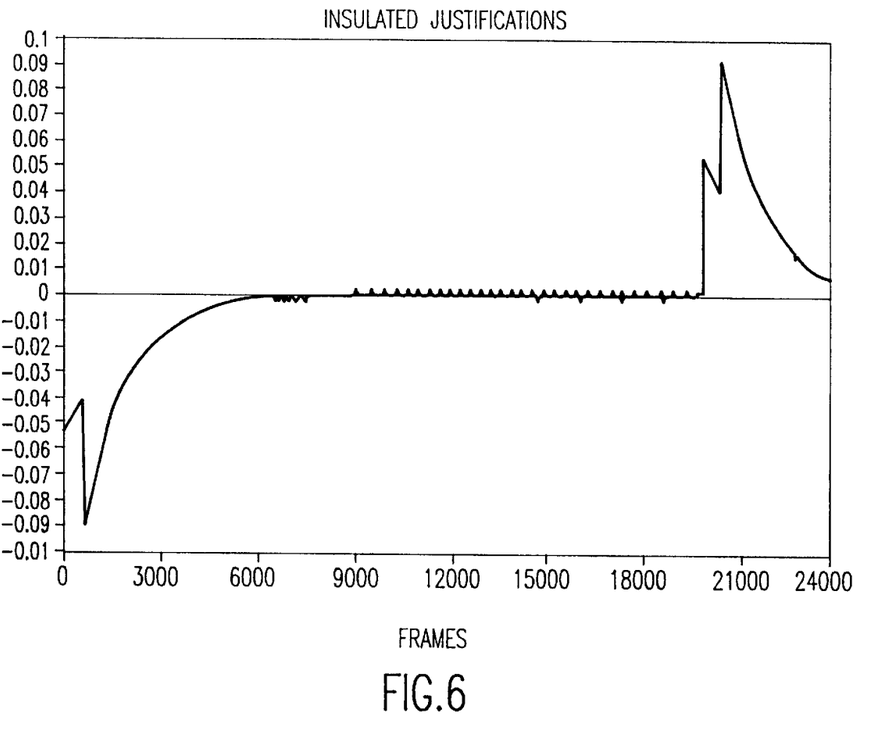
FIGS. 6 and 7 show the results obtained by implementing the present invention.
Figure 7:
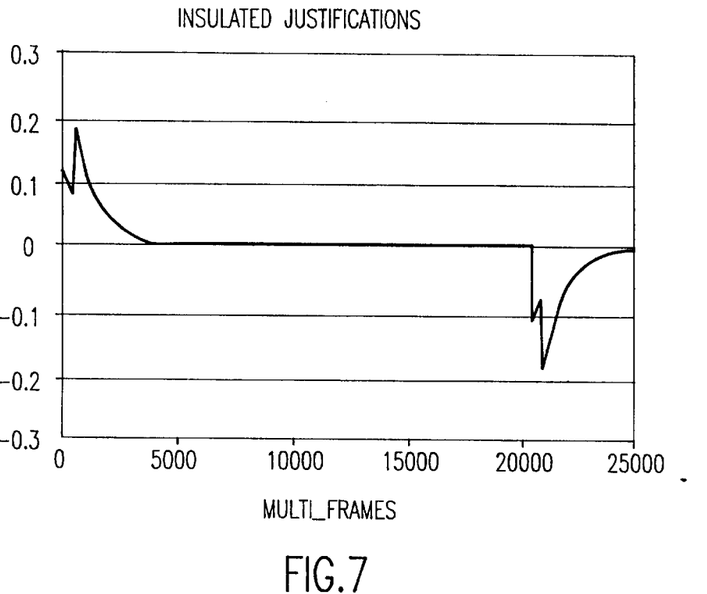

FIG. 6 and FIG. 7 show some results obtained by simulating the preferred implementation of the method of the present invention. They represent the peak-peak jitter, expressed in and estimated at the output of the measure bandpass filter as defined by the international standard (Table 7.1 of recommendation G.783), caused by the sequence of pointer justifications representing the more critical situation in terms of phase noise introduced by the SDH network. This sequence, formed by a double pointer justification followed by another double pointer justification of the opposite polarity, in case the periods between adjustments of opposite polarity are greater than the receiver time constant, is assumed as reference by the international standard. This standard establishes that the peak-peak jitter associated with the above-mentioned sequence must be under 0.75. FIG. 6 and FIG. 7 show how the method of the present invention satisfies this standard by a wide margin. FIG. 6 (FIG. 7) refers to a tributary 34368 kbit/sec (2048 kbit/sec) mapped in a frame STM1 (Synchronous Transport Module) according to the multiplexing path that goes from VC-3 (VC-12) to VC-4. The measure bandpass filter of the standardization organization for this tributary has upper and lower corner frequencies at 100 Hz (20 Hz) and 800 kHz (100 kHz), respectively, and has a slope of 20 dB for out of band decades.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A method for reducing phase noise introduced by pointer justifications from an SDH network (Synchronous Digital Hierarchy Network) in a transmitted numerical signal, in which method, occasional redundancies associated with bit justifications, fixed redundancies, and occasional prefiltered redundancies associated with the pointer justifications are combined, and wherein the combined signal is filtered in an APLL (Analog Phase Locked Loop), said method further comprising the steps of:

selecting whether the occasional redundancies associated with bit justifications are to be prefiltered;

prefiltering, in a two-stage prefilter, the occasional redundancies associated with the pointer justifications together with at least a part of the fixed redundancies, with or without the occasional redundancies associated with bit justifications to obtain a prefilter output; and combining the prefiltered fixed redundancies and prefiltered occasional redundancies associated with the pointer justifications with the occasional redundancies associated with the bit justifications whenever the redundancies with the bit justification are not prefiltered.

2. A method according to claim 1, further comprising the steps of:

establishing an ideal response law of said prefilter;

detecting the presence of the occasional redundancies associated with bit justifications and establishing the necessity of prefiltering the occasional redundancies associated with the bit justifications;

deciding and performing pulse suppression on a reference clock so that, with a phase difference as minimum as possible, the prefilter output coincides with said ideal response law of said prefilter to obtain a modified clock signal having suppressed pulses;

accommodating the bit justifications in said modified clock signal whenever the redundancies associated with the bit justifications are not filtered to obtain an accommodation clock signal;

reclocking the transmitted numerical signal using the accommodation clock signal to obtain a reclocked numerical signal;

filtering the reclocked numerical signal with the APLL, for reconstructing a continuous data flow.

3. A method according to claim 2, further comprising the step of establishing, as a prefilter transfer function, the transfer function of a second order PLL, in which the output frequency variation is obtained by suppressing pulses in said reference clock without changing the oscillation period.

4. A method according to claim 2, further comprising the step of obtaining a digital phase locked loop by a modulator generating pulses in conjunction with which pulses are suppressed in said reference clock.

5. A method according to claim 2, further comprising the step of using the output phase of a clock signal generated by a digital phase locked loop to reproduce a phase obtained by an analog phase locked loop with a phase difference as minimum as possible.

6. An apparatus for reducing phase noise introduced by pointer justifications from an SDH network (Synchronous Digital Hierarchy Network) in a transmitted numerical signal, in which apparatus, occasional redundancies associated with bit justifications, fixed redundancies and occasional redundancies associated with the pointer justifications are combined, and wherein the combined signal is filtered in an analog phase locked loop, said apparatus comprising:

means for prefiltering, in a two-stage prefilter, the occasional redundancies associated with the pointer justifications together with at least a part of the fixed redundancies with or without said occasional redundancies associated with bit justifications;

means for selecting whether said redundancies associated with the bit justifications selectively are to be prefiltered; and     means for combining said prefiltered fixed redundancies and said prefiltered occasional redundancies associated with the pointer justifications with the occasional redundancies associated with the bit justifications whenever said redundancies associated with the bit justifications are not prefiltered.

7. An apparatus according to claim 6, further comprising a prefilter formed by a phase comparator a numerical filter and a voltage controlled oscillator (VCO) of type ON/OFF.

8. An apparatus according to claim 7, wherein said prefilter is coupled to a buffer for reclocking the transmitted numerical signal such that, after a clocking operation, the transmitted numerical signal can be easily filtered.

9. An apparatus for reducing phase noise introduced by pointer justifications from an SDH network (Synchronous Digital Hierarchy Network) in a transmitted numerical signal, in which apparatus, occasional redundancies associated with bit justifications, fixed redundancies and occasional redundancies associated with the pointer justifications are combined, and wherein the combined signal is filtered in an analog phase locked loop, said apparatus comprising:

a two-stage prefilter prefiltering the occasional redundancies associated with the pointer justifications together with at least a part of the fixed redundancies, with or without said occasional redundancies associated with bit justifications;

a controller that selects whether redundancies associated with the bit justifications are prefiltered; and     a combining circuit combining said prefiltered fixed redundancies and said prefiltered occasional redundancies associated with the pointer justifications with the occasional redundancies associated with the bit justifications whenever said redundancies associated with the bit justifications are not prefiltered as selected via said external controller.

10. An apparatus according to claim 9, in which the prefilter comprises a phase comparator, a numerical filter, and a voltage controlled oscillator (VCO) of type ON/OFF.

11. An apparatus according to claim 10, wherein said prefilter is coupled to a buffer for reclocking the transmitted numerical signal such that, after a clocking operation, the transmitted numerical signal can be easily filtered.

* * * * *